United States Patent
Leonard, III et al.

(10) Patent No.: US 10,840,064 B2
(45) Date of Patent: Nov. 17, 2020

(54) DURABLE AUTO-IGNITION DEVICE FOR PLASMA REACTOR

(71) Applicant: ReCarbon, Inc., Santa Clara, CA (US)

(72) Inventors: George Stephen Leonard, III, Oakland, CA (US); Stefan Andrew McClelland, San Jose, CA (US); Curtis Peter Tom, San Mateo, CA (US)

(73) Assignee: RECARBON, INC., Santa Clara, CA (US)

(*) Notice: Subject to any disclaimer, the term of this patent is extended or adjusted under 35 U.S.C. 154(b) by 0 days.

(21) Appl. No.: 16/805,661

(22) Filed: Feb. 28, 2020

(65) Prior Publication Data

US 2020/0306716 A1   Oct. 1, 2020

Related U.S. Application Data

(60) Provisional application No. 62/823,436, filed on Mar. 25, 2019, provisional application No. 62/823,492, filed on Mar. 25, 2019, provisional application No. 62/823,505, filed on Mar. 25, 2019, provisional application No. 62/823,508, filed on Mar. 25, 2019, provisional application No. 62/823,514, filed on Mar. 25, 2019, provisional application No. 62/823,517, filed on Mar. 25, 2019, provisional application No. 62/823,484, filed on Mar. 25, 2019.

(51) Int. Cl.
*H01J 37/32* (2006.01)
*C23C 16/511* (2006.01)
(Continued)

(52) U.S. Cl.
CPC ......... *H01J 37/32229* (2013.01); *B01J 19/12* (2013.01); *C23C 16/511* (2013.01); *G01J 1/0425* (2013.01); *G01J 1/0492* (2013.01); *G01J 1/429* (2013.01); *G01J 1/4228* (2013.01); *H01J 37/32449* (2013.01); *H01J 37/32623* (2013.01); *H01J 37/32844* (2013.01);
(Continued)

(58) Field of Classification Search
CPC .......... H01J 37/32201; H01J 37/32192; H01J 37/32357; H01J 37/32449
USPC .................................................. 315/111.21
See application file for complete search history.

(56) References Cited

U.S. PATENT DOCUMENTS 4,841,925 A * 6/1989 Ward .................... F02P 3/0884
123/143 B
8,633,648 B2  1/2014 Tanibata et al.
(Continued)

FOREIGN PATENT DOCUMENTS

| KR | 10-2017-0006007 A | 1/2017 |
| KR | 10-2018-0114614 A | 10/2018 |
| WO | 2018-093537 A1 | 5/2018 |

*Primary Examiner* — Tung X Le
(74) *Attorney, Agent, or Firm* — Patent Office of Dr. Chung Park

(57) ABSTRACT

The present invention provides a plasma generating system that includes: a plasma cavity for generating a plasma therewithin by use of microwave energy; an adaptor electrically grounded and having a gas outlet through which an exhaust gas processed by the plasma exits the plasma cavity; and an ignition device mounted on the adaptor. The ignition device includes: a first electrode electrically grounded; and a second electrode electrically floating and configured to convert a portion of the microwave energy into an electrostatic discharge to thereby develop a voltage difference between the first and second electrodes, where the voltage difference generates a spark discharge between the first electrode and the second electrode to create the plasma.

20 Claims, 7 Drawing Sheets

(51) Int. Cl.
   *H05H 1/46*   (2006.01)
   *G01J 1/04*   (2006.01)
   *G01J 1/42*   (2006.01)
   *B01J 19/12*  (2006.01)

(52) U.S. Cl.
   CPC ......... *H01J 37/32972* (2013.01); *H05H 1/46* (2013.01); *H01J 37/32192* (2013.01); *H01J 37/32513* (2013.01); *H01J 2237/1502* (2013.01); *H05H 2001/469* (2013.01); *H05H 2001/4622* (2013.01)

(56) References Cited

U.S. PATENT DOCUMENTS

| | | |
|---|---|---|
| 9,699,880 B2 | 7/2017 | Lee et al. |
| 2004/0075396 A1* | 4/2004 | Okumura ............ H05H 1/2406 315/169.3 |
| 2006/0266637 A1 | 11/2006 | Gutsol |
| 2011/0115378 A1* | 5/2011 | Lubomirsky ..... H01J 37/32357 315/111.21 |
| 2013/0263834 A1* | 10/2013 | Tanaya .................... F02P 15/10 123/623 |
| 2015/0097485 A1 | 4/2015 | Vane |
| 2016/0268107 A1* | 9/2016 | White ............... H01J 37/32899 |
| 2020/0058469 A1* | 2/2020 | Ranjan ................ C23C 16/517 |

\* cited by examiner

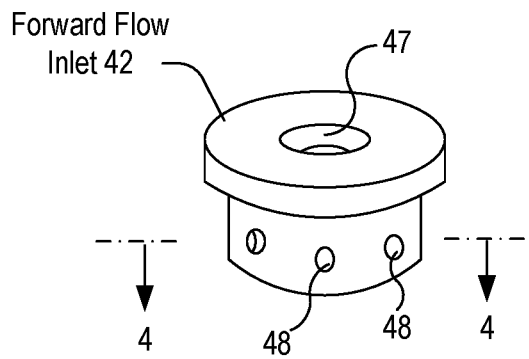
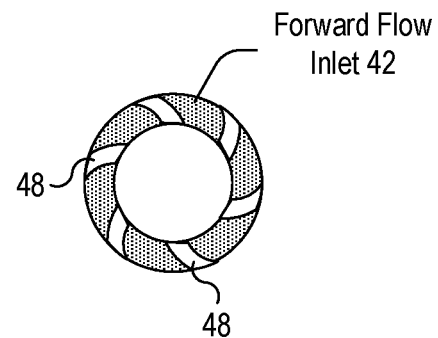
FIG. 3
FIG. 4
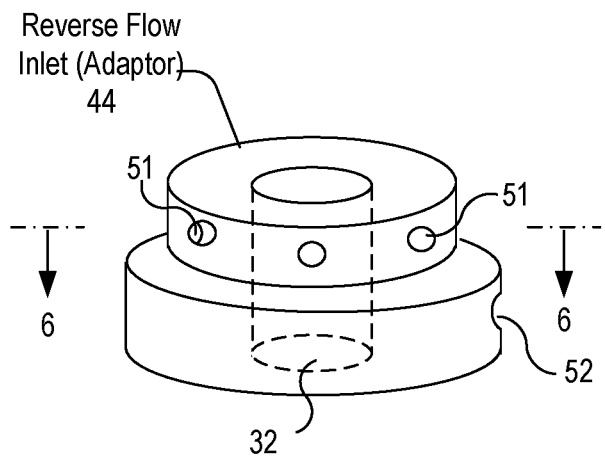
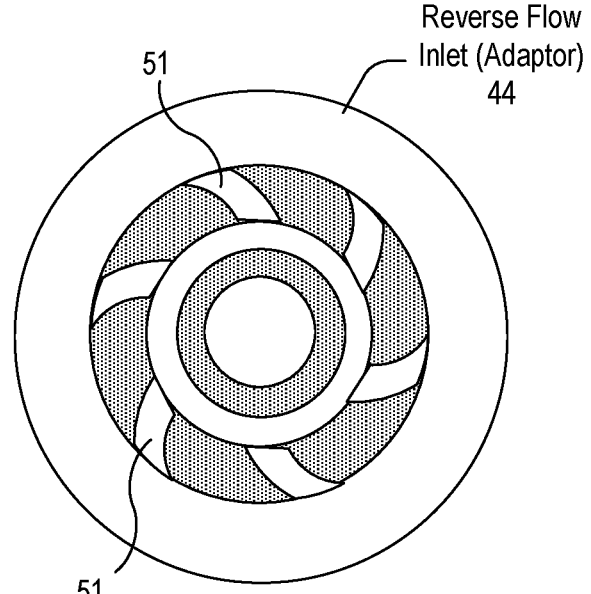
FIG. 5
FIG. 6

US 10,840,064 B2

DURABLE AUTO-IGNITION DEVICE FOR PLASMA REACTOR

CROSS-REFERENCE TO PRIOR APPLICATIONS

This application claims priority of U.S. Patent Application Nos. 62/823,436; 62/823,492; 62/823,505; 62/823,508; 62/823,514; 62/823,517; and 62/823,484, which are hereby incorporated by reference in their entirety.

BACKGROUND OF THE INVENTION

1. Field of the Invention

The present invention relates to plasma generators, and more particularly to devices for plasma ignition.

2. Discussion of the Related Art

In recent years, microwave technology has been applied to generate various types of plasma. Typically, a microwave discharge, which is used as a plasma source, is achieved by coupling microwave energy into a discharge chamber containing gas to be processed. In the current state of the art of hydrocarbon reforming plasmas, a high voltage power for generating a spark, a hypergolic substance, and/or an easily ionizable ignition gas, such as argon, are externally supplied for ignition, i.e., creation of the seed plasma. Also, the supplied microwave energy power needs to be impedance matched between the ignition and steady-state operating regimes. In general, such devices necessary to create the seed plasma and transition to steady-state operation invariably add undesirable cost and complexity.

As such, there is a need for a device that can ignite plasma in a plasma reactor and allow transition to steady state operation on the plasma reactor without the use of the conventional devices for creating and maintaining the plasma.

SUMMARY OF THE INVENTION

According to one aspect of the present invention, a plasma generating system that includes: a plasma cavity for generating a plasma therewithin by use of microwave energy; an adaptor electrically grounded and having a gas outlet through which an exhaust gas processed by the plasma exits the plasma cavity; and an ignition device mounted on the adaptor. The ignition device includes: a first electrode electrically grounded; and a second electrode electrically floating and configured to convert a portion of the microwave energy into an electrostatic discharge to thereby develop a voltage between the first and second electrodes, the voltage generating a spark discharge between the first electrode and the second electrode to create the plasma.

According to another aspect of the present invention, an ignition device for generating a plasma by use of microwave energy in a plasma chamber includes: a first electrode electrically grounded; and a second electrode electrically floating and configured to convert a portion of microwave energy into an electrostatic discharge to thereby develop a voltage between the first and second electrodes, the voltage generating a spark discharge between the first electrode and the second electrode to create a plasma.

BRIEF DESCRIPTION OF THE DRAWINGS

FIG. 3 shows a perspective view of a forward flow inlet according to embodiments of the present disclosure.

FIG. 4 shows a cross sectional view of the forward flow inlet in FIG. 3, taken along the line 4-4, according to embodiments of the present disclosure.

FIG. 5 shows a perspective view of a reverse flow inlet according to embodiments of the present disclosure.

FIG. 6 shows a cross sectional view of the reverse flow inlet in FIG. 5, taken along the line 6-6, according to embodiments of the present disclosure.

DETAILED DESCRIPTION OF THE PREFERRED EMBODIMENTS

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways.

Components, or modules, shown in diagrams are illustrative of exemplary embodiments of the disclosure and are meant to avoid obscuring the disclosure. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components.

Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. Also, the appearances of the above-noted phrases in various places in the specification are not necessarily all referring to the same embodiment or embodiments.

The use of certain terms in various places in the specification is for illustration and should not be construed as limiting. The terms "include," "including," "comprise," and "comprising" shall be understood to be open terms and any lists the follow are examples and not meant to be limited to the listed items.

Figure 1:
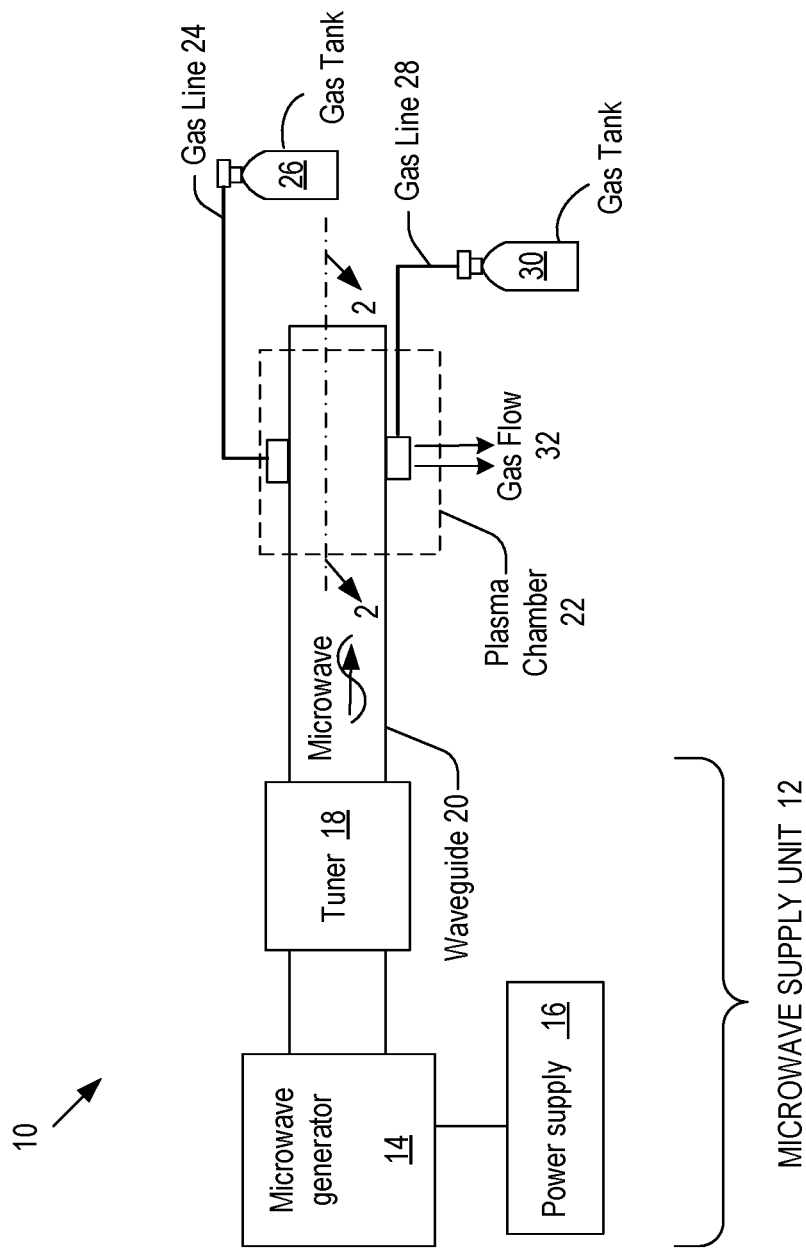
FIG. 1 shows a schematic diagram of a plasma generating system according to embodiments of the present disclosure.

FIG. 1 ("FIG. 1") shows a schematic diagram of a plasma generating system 10 according to embodiments of the present disclosure. As depicted, the plasma generating system 10 includes: a microwave cavity/waveguide 20 having a shape of a hollow tube; a plasma chamber 22 connected to the waveguide 20; and a microwave supply unit 12 connected to the waveguide 20 and operative to provide microwave energy to the plasma chamber 22 via a microwave waveguide 20. In embodiments, the plasma chamber 22 receives the microwave energy and processes gas by use of the received microwave energy. In embodiments, a gas tank 26 provides gas to the plasma chamber 22 via a gas line 24, and a gas tank 30 provides gas to the plasma chamber 22 via a gas line 28.

The microwave supply unit 12 provides microwave energy to the plasma chamber 22 and includes: a microwave generator 14 for generating microwaves; a power supply 16 for supplying power to the microwave generator 14; and a tuner 18 for reducing the microwave energy reflected from the plasma chamber 22 and travelling toward the microwave generator 14. In embodiments, the microwave supply unit 12 may include other components, such as an isolator having a dummy load for dissipating reflected microwave energy that propagates toward the microwave generator 14 and a circulator for directing the reflected microwave energy to the dummy load and a sliding short circuit disposed at the end of the waveguide 20.

Figure 2:
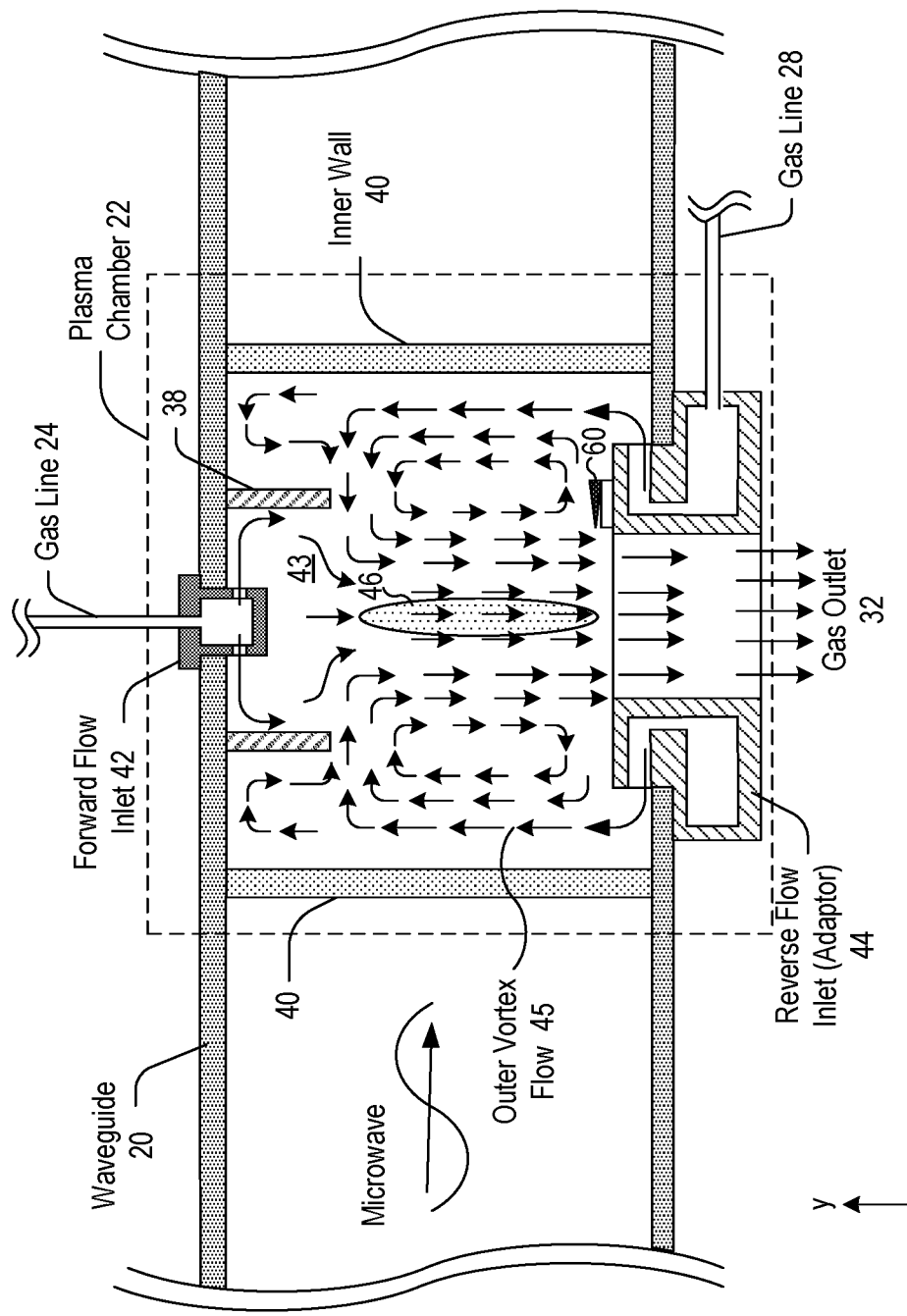
FIG. 2 shows a cross sectional view of a plasma chamber in FIG. 1, taken along the line 2-2, according to embodiments of the present disclosure.

FIG. 2 shows a cross sectional view of a plasma chamber 22 in FIG. 1, taken along the line 2-2, according to embodiments of the present disclosure. As depicted, the plasma chamber 22 includes: an inner wall(s) 40; a plasma stabilizer 38; a forward flow inlet 42 connected to the gas line 24 and configured to introduce the forward flow into the plasma chamber; and a reverse flow inlet (which is also referred to as adaptor) 44 connected to the gas line 28 and configured to introduce the reverse flow into the plasma chamber. Here, the term plasma cavity refers to the enclosed space that is surrounded by the inner wall 40, waveguide 20, forward flow inlet 42 and reverse flow inlet (adaptor) 44, where the reverse flow gas and forward flows are processed/reformed by plasma plume (or shortly, plasma) 46 in the plasma cavity using the microwave energy transmitted via the waveguide 20.

In embodiments, the inner wall 40 is formed of a material that is transparent to the microwave energy, such as quartz or ceramic. In embodiments, the inner wall 40 is formed of any other suitable dielectric material that is desirable for uniform flow, thermal resistance, chemical resistance, and electromagnetic transparency. In embodiments, the inner wall 40 has preferably, but not limited to, a shape of hollow circular cylinder.

FIG. 3 shows a perspective view of the forward flow inlet 42 according to embodiments of the present disclosure. FIG. 4 shows a cross sectional view of the forward flow inlet 42, taken along the line 4-4, according to embodiments of the present disclosure. As depicted, the forward flow inlet 42 has a hole/adaptor 47 for coupling to the gas line 24 and one or more gas passageways 48 that are formed in the wall thereof. In embodiments, the exits of the gas passageways 48 are located inside the plasma stabilizer 38 so that the plasma stabilizer 38 forms an inner vortex flow 43 using the flow exiting the gas passageways 48. In embodiments, the inner diameter of the plasma stabilizer 38 may be varied to adjust the outer diameter of the inner vortex flow 43. In embodiments, as discussed above, the plasma stabilizer 38 may have a shape of hollow circular cylinder and disposed concentrically to the forward flow inlet 42.

In embodiments, each gas passageway 48 is arranged to impart spiral motion to the forward flow as the forward flow enters the plasma cavity via the gas passageway 48. In embodiments, each gas passageway 48 may be curved to enhance the vorticity of the forward flow. In embodiments, the forward flow inlet 42 is formed of any suitable material, such as metal or dielectric material, so that the inlet is electrically isolated from the waveguide 20 and withstand the heat energy from the plasma 46.

Figure 7:
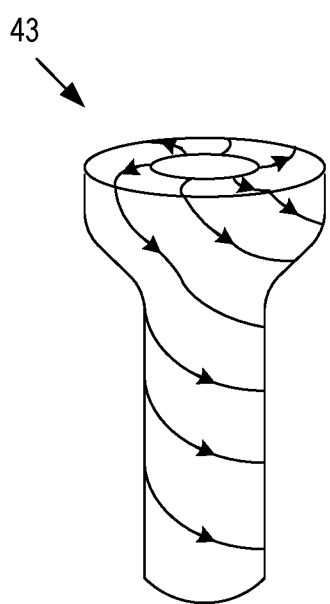
FIG. 7 shows a perspective view of an inner vortex flow according to embodiments of the present disclosure.

In embodiments, the plasma stabilizer 38 is formed of material that is transparent to the microwave energy, and preferably formed of the same material as the inner wall 40. In embodiments, the plasma stabilizer 38 is attached to the waveguide 20, protruding into the plasma cavity, where the axial direction of the plasma stabilizer 38 is parallel to the y-axis. In embodiments, as discussed above, the inner wall 40 may have a shape of a hollow circular cylinder and the plasma stabilizer 38 may be installed concentrically to the inner wall 40. In embodiments, the forward flow inside the plasma stabilizer 38 forms the inner vortex flow 43 and proceeds toward the other end of the waveguide 20, more specifically toward the gas outlet 32. FIG. 7 shows a perspective view of the inner vortex flow 43 according to embodiments of the present disclosure. As depicted, the forward flow (or equivalently, inner vortex flow) travels the length of the inner wall 40 in a helical motion until the inner vortex flow exits the gas outlet 32.

In embodiments, upon ignition of the plasma 46 by a plasma igniter (which is also referred to as auto-ignition device) 60, the plasma 46 is sustained by the microwave energy transmitted by the microwave generator 14. In embodiments, the plasma 46 is located within the inner vortex flow 43 so that the gas particles of the inner vortex flow 43 pass through the plasma 46. In embodiments, the plasma stabilizer 38 determines the outer diameter of the inner vortex flow 43, preventing the forward flow from bypassing the plasma 46 before exiting the plasma cavity through the gas outlet 32. In embodiments, the plasma stabilizer 38 aids in keeping the plasma 46 stable by separating the inner vortex flow 43 from the outer vortex flow 45.

FIG. 5 shows a perspective view of the reverse flow inlet (adaptor) 44 according to embodiments of the present disclosure. FIG. 6 shows a cross sectional view of the reverse flow inlet (adaptor) 44, taken along the line 6-6, according to embodiments of the present disclosure. As depicted, the reverse flow inlet (adaptor) 44 has a hole/adaptor 52 for coupling to the gas line 28, a hole to form the gas outlet 32, and one or more gas passageways 51 that are formed in the wall thereof. In embodiments, each gas passageway 51 is arranged to impart spiral motion to the reverse flow as the reverse flow enters the plasma cavity via the gas passageway 51. In embodiments, each gas passageway 51 may be curved to enhance the vorticity of the reverse flow. In embodiments, the reverse flow inlet (adaptor) 44 is formed of preferably, but not limited to Ni alloy, such as Inconel or Hastelloy.

Figure 8:
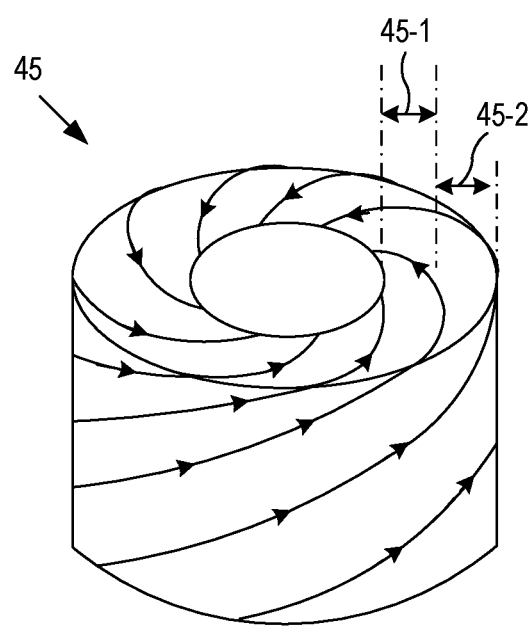
FIG. 8 shows a perspective view of an outer vortex flow according to embodiments of the present disclosure.

In embodiments, the reverse flow exiting the reverse flow inlet (adaptor) 44 travels toward to the inner wall 40 and then proceeds upwardly (y-axis direction) toward the other end of the waveguide 20 along the inner wall 40 in a helical motion. Subsequently, the reverse flow reverses the flow direction to proceed downwardly and form an outer vortex flow 45. In embodiments, the rotational axis of the outer vortex flow 45 is substantially parallel to the y-axis. FIG. 8 shows a perspective view of the outer vortex flow 45 according to embodiments of the present disclosure. As depicted, the outer vortex flow 45 has a hollow cylinder shape and has two flow regions: inner downward flow region 45-1 and an outer upward flow region 45-2. In embodiments, the inner vortex flow 43 is disposed in the middle hollow portion of the outer vortex flow 45 and surrounded by inner downward flow region 45-1. It is noted that the gas from the forward flow inlet 42 is mixed with the flow from the reverse flow inlet (adaptor) 44 to form the inner vortex flow 43.

In embodiments, the outer vortex flow 45 surrounds the inner vortex flow 43, to thereby shield the inner wall 40 from the plasma 46. In embodiments, the reverse flow exiting the reverse flow inlet (adaptor) 44 may have the ambient temperature and take heat energy from the inner wall 40 as the outer vortex flow 45 travels upwardly along the inner wall 40 in the helical motion.

In embodiments, as discussed above, the inner diameter of the plasma stabilizer 38 determines the radial dimension of the inner vortex flow 43. As such, in embodiments, the inner diameter of the plasma stabilizer 38 may be adjusted so that the outer vortex flow 45 surrounds the inner vortex flow 43 and maintain the flow regime of the inner vortex flow 43 in a stable manner to thereby stabilize the plasma and yield improved throughput and efficiency In embodiments, the plasma 46 is used to reform the inlet gas to the desired product gas, where the inlet gas is introduced into the plasma cavity by the forward flow inlet 42 and reverse flow inlet (adaptor) 44. In embodiments, the gas composition of the inner vortex flow exiting the forward flow inlet 42 includes $CO_2$, $CH_4$ and $O_2$, and the gas exiting the gas outlet 32 includes CO and $H_2$ as well as a non-reacted portion of forward flow gas. In embodiments, the preferred distribution for the forward flow is 5%-95% by mass of the total flow into the plasma chamber 22. In embodiments, the reverse flow may have the same gas composition of the forward flow. In alternative embodiments, the forward flow may have different gas composition from the reverse flow. Also, the gas composition of the forward flow (and/or reverse flow) may be changed during operation. For instance, the forward flow may include a slug of argon to aid ignition of the plasma 46. In embodiments, the gas compositions and flow rates of the forward and reverse flows may be adjusted to enhance the plasma stability and efficiency of the chemical reaction in the plasma chamber 22.

It is noted that the plasma chamber 22 may have different components and arrangement of the components. For instance, the plasma chamber 22 may not include the forward flow inlet 42, i.e., the waveguide 20 does not have any hole for receiving the forward flow inlet. In another example, the plasma stabilizer 38 may be mounted on the reverse flow inlet (adaptor) 44. The description of various embodiments of the plasma chamber 22 can be found in a copending U.S. patent application Ser. No. 16/752,689, entitled "Plasma reactor for processing gas," filed on Jan. 26, 2020, which is hereby incorporated by reference in its entirety.

Figure 9:
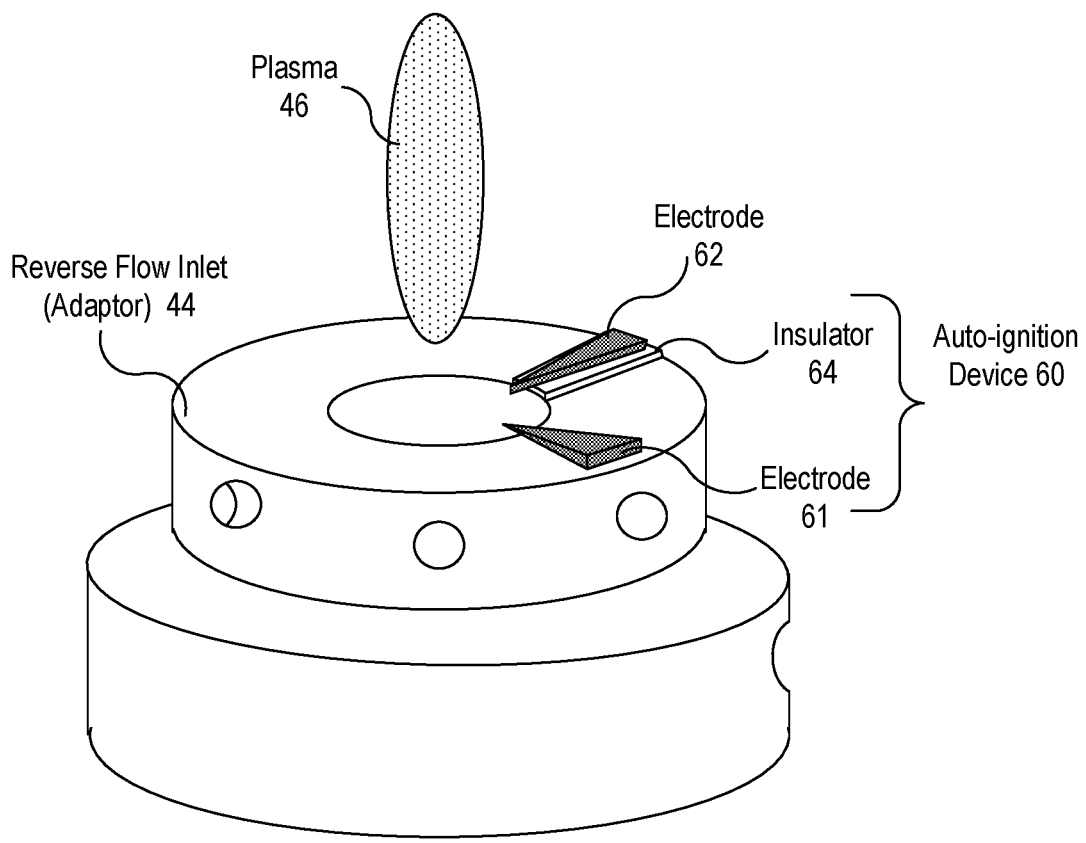
FIG. 9 shows a perspective view of an auto-ignition device according to embodiments of the present disclosure.
Figure 10:
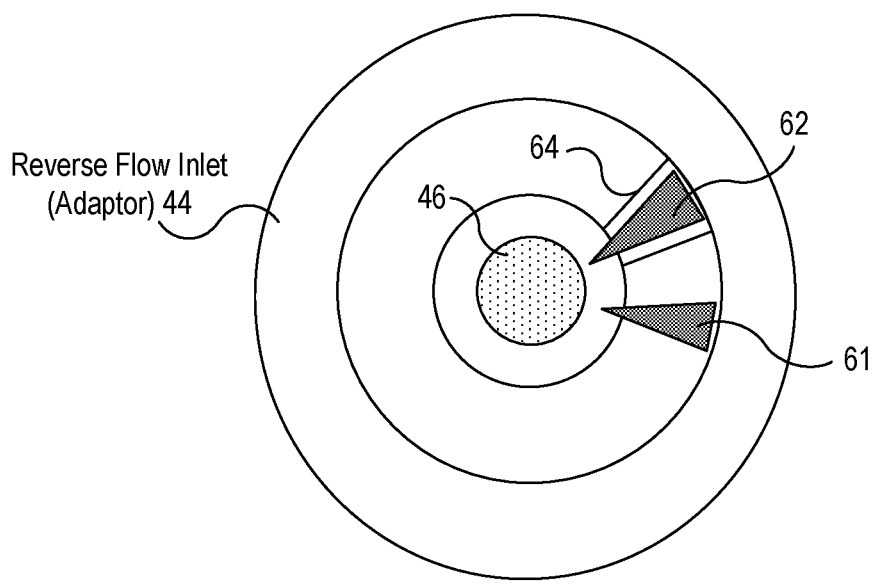
FIG. 10 shows a top view of the auto-ignition device in FIG. 9 according to embodiments of the present disclosure.

As depicted in FIG. 2, the plasma chamber 22 includes an auto-ignition device 60. In embodiments, the auto-ignition device 60 ignites the plasma 46 and allows transition to the steady state operation on the plasma chamber 22 without the use of conventional consumable materials and ignition specific reagent, impedance matching, or external power sources, such as high voltage power sources, to ignite plasma. FIG. 9 shows a perspective view of the auto-ignition device 60 according to embodiments of the present disclosure. FIG. 10 shows a top view of the auto-ignition device 60 in FIG. 9 according to embodiments of the present disclosure. For the purpose of illustration, the plasma 46 is shown in FIGS. 9 and 10.

As depicted, the auto-ignition system 60 includes a pair of electrodes 61 and 62. In embodiments, the electrode 61, which is a ground electrode, is electrically connected to a ground. In embodiments, the electrode 62, which is a floating electrode, is electrically floating and insulated from the reverse flow inlet (adaptor) 44 by an insulator 64 and from the electrode 61 by the air/gas gap. As discussed above, the reverse flow inlet (adaptor) 44 may be formed of electrically conducting metal, and secured to the ground via the wall of the plasma chamber 22 (such as waveguide 20) to thereby electrically be grounded. In embodiments, the electrode 61 is in direct contact with the reverse flow inlet (adaptor) 44, to thereby be electrically grounded. In embodiments, the electrode 61 is secured to the reverse flow inlet (adaptor) 44 by a suitable fastening mechanism, such as screw. In embodiments, the electrode 61 is electrically grounded by use of other suitable mechanisms, such as an electrically conducting wire (not shown in FIG. 9) that are in contact with both the electrode 61 and/or the wall of the plasma chamber 22.

In embodiments, the electrode 61 is of a geometry, placement, and material such as to facilitate a spark discharge from the electrode 62 and have a minimal cross section with respect to the incident microwave energy supplied from the microwave generator 14 so as to minimize the disturbance/absorption of the microwave energy by the electrode 61. In embodiments, the electrode 61 is formed of electrically conducting material, such as metal.

In embodiments, the electrode 62, which operates as an antenna for converting a portion of the microwave energy into electrostatic charge, is of a geometry, placement, and material such that, upon application of the microwave energy used to operate plasma 46, an electrostatic charge builds up in the electrode 62. In embodiments, a sharp point on the electrode 62 develops a voltage (i.e. electrical potential). In embodiments, the spark discharge between electrodes 61 and 62 due to the electrical potential concentrates sufficient energy to create a small amount of plasma which interacts with the supplied microwave energy so as to propagate to the steady state plasma without human operator's intervention, i.e., the electrodes 61 and 62 operate as an auto-ignition system and allow transition to the steady state without additional intervention. In embodiments, the electrode 62 is formed of electrically conducting material, such as metal.

In embodiments, the electrodes 61 and 62 exist adjacent to but removed from plasma zone, where the plasma zone refers to the space occupied by the plasma 46. In embodiments, in the steady state, plasma 46 does not touch or attach either electrode 61 or electrode 62 so as to prevent damage to either electrode. In embodiments, in the steady state, the electrode 61 is disposed downstream of the plasma 46 so that the microwave energy is absorbed by the plasma 46 before microwave energy is disturbed by the electrode 61, i.e., the electrode 61 is located downstream of the plasma 46 in the direction of the microwave energy flow (or equivalently, the electrode 61 is located within the shadow of the plasma).

In embodiments, the placement of electrodes 61 and 62 is such that, in the steady state, electrodes 61 and 62 exist within the electromagnetic shadow of plasma 46 such that the electrodes no longer experience significant flux of the microwave energy. Stated differently, in the steady state, the electrodes 61 and 62 are disposed downstream of the plasma 46 so that the microwave energy is absorbed by the plasma 46 before microwave energy is disturbed by the electrodes, i.e., the electrodes 61 and 62 are located within the shadow of the plasma 46. In embodiments, the separation distance between the electrodes (especially the pointed tips of the electrodes) ranges from 0.1 to 10.0 mm.

Figure 11:
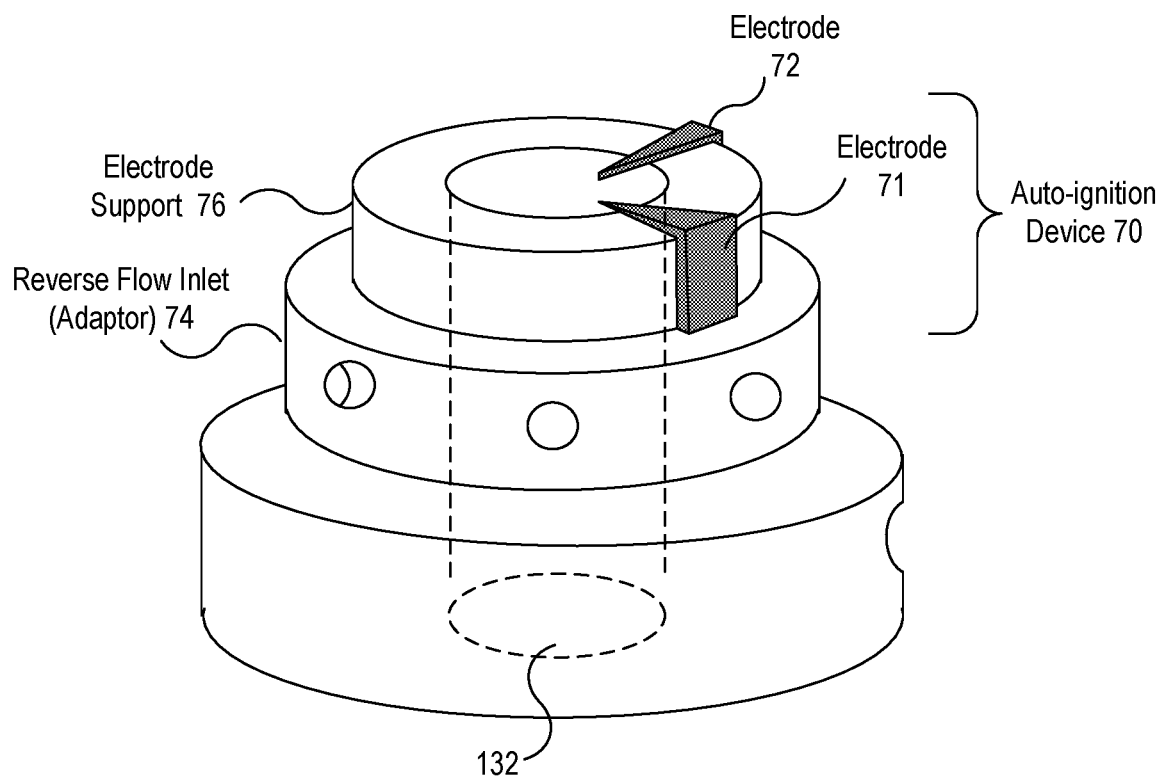
FIG. 11 shows a perspective view of an auto-ignition device according to embodiments of the present disclosure.
Figure 12:
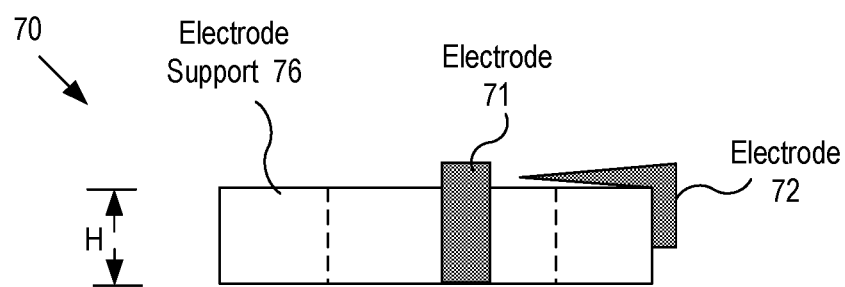
FIG. 12 shows a side view of the auto-ignition device in FIG. 11 according to embodiments of the present disclosure.

FIG. 11 shows a perspective view of an auto-ignition device 70 according to embodiments of the present disclosure. FIG. 12 shows a side view of the auto-ignition device 70 according to embodiments of the present disclosure. As depicted, the auto-ignition device 70 includes: an electrode support 76 that is mounted on a reverse flow inlet (which is also referred to as adaptor) 74 and formed of electrically insulating material and transparent to the microwave energy; an electrode 71 that has similar functions as the electrode 61; and an electrode 72 that has similar functions as the electrode 62. In embodiments, the reverse flow inlet (adaptor) 74 has the similar structure and function as the reverse flow inlet (adaptor) 44. In embodiments, the electrode support 76 has a circular ring (or hollow cylinder) shape, and has a hole that is in fluid communication with the through hole of the adaptor 74.

In embodiments, the electrode 71 has a top portion disposed on the top surface of the electrode support 76 and a shank disposed on the side surface of the electrode support 76. In embodiments, the length of the shank is the same as (or longer than) the height (H) of the electrode support 76 so that the bottom end of the shank touches the reverse flow inlet (adaptor) 74 that is electrically grounded. In embodiments, the electrode 71 is grounded via the reverse flow inlet (adaptor) 74. In embodiments, the electrode 71 is secured to the reverse flow inlet (adaptor) 74 by a suitable fastening mechanism, such as screw. In embodiments, the electrode 71 is electrically grounded by use of other suitable mechanisms, such as an electrically conducting (not shown in FIG. 12) that are in contact with both the electrode 71 and/or the wall of the plasma chamber 22. In embodiments, the electrode 71 is formed of electrically conducting material, such as metal.

In embodiments, the electrode 72 has a top portion disposed on the top surface of the electrode support 76 and a dangling shank disposed on the side surface of the electrode support 76. In embodiments, the length of the shank is shorter than the height (H) of the electrode support 76 so that the electrode 72 is electrically floating. In embodiments, the dangling shank of the electrode 72 is used for dual purposes: facilitating attachment to electrode support 76 and acting as an antenna so as to absorb incident microwave energy. In embodiments, the electrode 72 is formed of electrically conducting material, such as metal. In embodiments, the electrodes 71 and 72 are disposed in the downstream (i.e. within the shadow) of the plasma.

Figure 13:
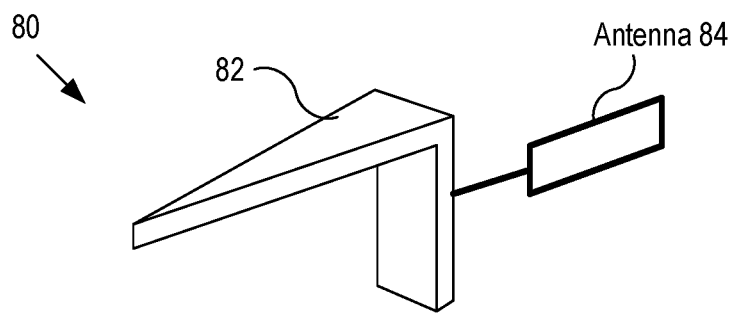
FIG. 13 shows a perspective view of an electrode according to embodiments of the present disclosure.

FIG. 13 shows a perspective view of an electrode according to embodiments of the present disclosure. As depicted, the electrode 80 may be used in place of the floating electrode 62 (or 72). In embodiments, the electrode 80 includes a body 82 and an antenna 84. In embodiments, the antenna 84 increases the amount of microwave energy that is converted to electrostatic potential in electrode 80 so as to ultimately provide a more powerful spark between the electrodes. It is noted that the antenna 84 may be formed of conducting material, such as metal, and have various shapes, such as wire, mesh, or thin plate (rectangle, circle, oval, etc.).

Figure 14:
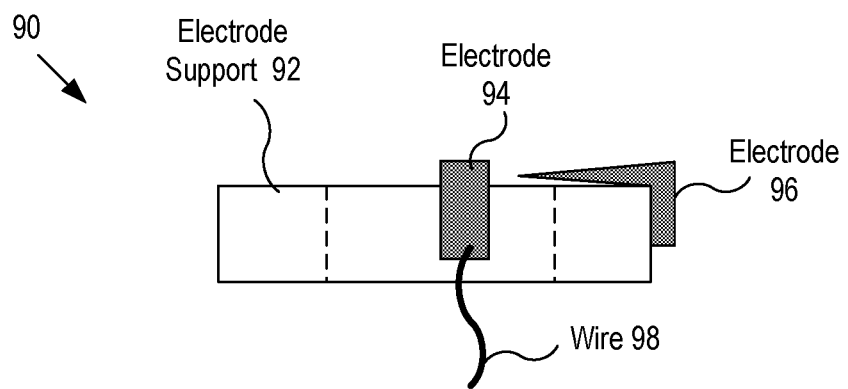
FIG. 14 shows a side view of an auto-ignition device according to embodiments of the present disclosure.

FIG. 14 shows a side view of an auto-ignition device 90 according to embodiments of the present disclosure. As depicted, the auto-ignition device 90 is similar to the auto-ignition device 70, with the difference that the electrode 94 is not in direct contact with the adaptor; instead, the electrode 94 is grounded by an electrically conducting wire 98.

In embodiments, the electrical support 92 and the electrode 96 have the similar structures and functions as their counterparts in FIG. 12.

In embodiments, the ground electrodes in FIGS. 1-10 are electrically grounded via the reverse flow inlet (adaptor) that is grounded. However, it should be apparent to those of ordinary skill in the art that the electrical wire that is similar to the electrical wire 98 may be also used to ground the electrode.

In alternative embodiments, multiple pairs of electrodes may be employed so as to create more opportunities for electrical discharge and subsequent ignition. In alternative embodiments, the floating electrode may be positioned such that it arcs directly to the reverse flow inlet (adaptor) 44 to effect ignition, i.e., the ground electrode, such as electrode 61, is not included in the auto-ignition devices.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A plasma generating system, comprising:
a plasma cavity for generating a plasma therewithin by use of microwaves in the plasma cavity;
an adaptor electrically grounded and having a gas outlet through which an exhaust gas processed by the plasma exits the plasma cavity; and
an ignition device mounted on the adaptor, including:
a first electrode electrically grounded; and
a second electrode electrically floating and configured to convert a portion of the microwaves into an electrostatic discharge to thereby develop a voltage between the first and second electrodes, the voltage generating a spark discharge between the first electrode and the second electrode to create the plasma.

2. A plasma generating system as recited in claim 1, wherein the first electrode has a first pointed tip and the second electrode has a second pointed tip and wherein a gap between the first and second pointed tips ranges from 0.1 to 10.0 mm.

3. A plasma generating system as recited in claim 1, wherein the first and second electrodes are located downstream of the plasma in a direction of a flow of the microwaves.

4. A plasma generating system as recited in claim 1, wherein the first electrode is in direct contact with the adaptor.

5. A plasma generating system as recited in claim 1, wherein the ignition device further includes:
an insulator mounted on and in direct contact with the adaptor,
wherein the second electrode is mounted on the insulator to thereby be electrically insulated from the adaptor.

6. A plasma generating system as recited in claim 1, wherein the ignition device further includes:
an electrode support mounted on the adaptor, formed of an electrically insulating material and being of a shape of a hollow cylinder that has a hole, wherein the hole of the electrode support being in fluid communication with the hole of the adaptor, wherein the first and second electrodes are mounted on and in direct contact with the electrode support.

7. A plasma generating system as recited in claim 6, wherein the first electrode includes a shank being disposed on a side surface of the electrode support and having one end in direct contact with the adaptor.

8. A plasma generating system as recited in claim 6, wherein the first electrode includes a shank being disposed on a side surface of the electrode support and having an electrically conducting wire for connecting to a ground.

9. A plasma generating system as recited in claim 6, wherein the second electrode includes a shank being disposed on a side surface of the electrode support and is electrically insulated from the adaptor.

10. A plasma generating system as recited in claim 6, wherein the second electrode includes an antenna that is configured to convert a portion of the microwaves into an electrostatic charge to develop an additional voltage between the first and second electrodes.

11. A plasma generating system as recited in claim 1, further comprising:
    a waveguide for transmitting the microwaves therethrough; and
    an inner wall disposed within the waveguide to define the plasma cavity and formed of material that is transparent to the microwaves.

12. An ignition device for generating a plasma by use of microwaves in a plasma chamber, comprising:
    a first electrode electrically grounded; and
    a second electrode electrically floating and configured to convert a portion of the microwaves into an electrostatic discharge to thereby develop a voltage between the first and second electrodes, the voltage generating a spark discharge between the first electrode and the second electrode to create a plasma.

13. An ignition device as recited in claim 12, wherein the first electrode has a first pointed tip and the second electrode has a second pointed tip and wherein a gap between the first and second pointed tips ranges from 0.1 to 10.0 mm.

14. An ignition device as recited in claim 12, further comprising:
    an adaptor electrically grounded and disposed in the plasma chamber and configured to introduce gas into the plasma chamber and having a hole through which an exhaust gas processed by the plasma exits the plasma chamber,
    wherein the first electrode is mounted on and in direct contact with the adaptor.

15. An ignition device as recited in claim 14, further comprising:
    an insulator mounted on and in direct contact with the adaptor,
    wherein the second electrode is mounted on the insulator to thereby be electrically insulated from the adaptor.

16. An ignition device as recited in claim 12, further comprising:
    an adaptor electrically grounded and disposed in the plasma chamber and configured to introduce gas into the plasma chamber and having a hole through which an exhaust gas processed by the plasma exits the plasma cavity; and
    an electrode support mounted on the adaptor that is formed of an electrically insulating material and having a shape of a hollow cylinder,
    wherein the first and second electrodes are mounted on the electrode support.

17. An ignition device as recited in claim 16, wherein the first electrode includes a shank being disposed on a side surface of the electrode support and having one end in direct contact with the adaptor.

18. An ignition device as recited in claim 16, wherein the first electrode includes a shank being disposed on a side surface of the electrode support and having an electrically conducting wire for connecting to a ground.

19. An ignition device as recited in claim 16, wherein the second electrode includes a shank being disposed on a side surface of the electrode support and is electrically insulated from the adaptor.

20. An ignition device as recited in claim 16, wherein the second electrode includes an antenna that is configured to convert a portion of the microwaves into an electrostatic charge to develop an additional voltage between the first and second electrodes.

* * * * *